United States Patent
Huang et al.

(10) Patent No.: US 8,199,510 B2
(45) Date of Patent: Jun. 12, 2012

(54) MULTI-LAYER SOC MODULE STRUCTURE

(75) Inventors: Chun-Ming Huang, Hsinchu (TW);
Chien-Ming Wu, Hsinchu (TW);
Chih-Chyau Yang, Hsinchu (TW);
Shih-Lun Chen, Hsinchu (TW);
Chin-Long Wey, Hsinchu (TW);
Chi-Shi Chen, Hsinchu (TW);
Chi-Sheng Lin, Hsinchu (TW)

(73) Assignees: National Chip Implementation Center, Hsinchu (TW); National Applied Research Laboratories, Hsinchu (TW)

( * ) Notice: Subject to any disclaimer, the term of this patent is extended or adjusted under 35 U.S.C. 154(b) by 269 days.

(21) Appl. No.: 12/685,723

(22) Filed: Jan. 12, 2010

(65) Prior Publication Data

US 2011/0096506 A1 Apr. 28, 2011

(30) Foreign Application Priority Data

Oct. 28, 2009 (TW) .............................. 98136383 A

(51) Int. Cl.
*H05K 7/20* (2006.01)

(52) U.S. Cl. ........ 361/721; 361/707; 361/729; 361/704; 361/719

(58) Field of Classification Search .................. 361/721, 361/707, 729, 719, 704
See application file for complete search history.

(56) References Cited

U.S. PATENT DOCUMENTS

| | | | | |
|---|---|---|---|---|
| 5,861,666 A | * | 1/1999 | Bellaar | 257/686 |
| 6,262,488 B1 | * | 7/2001 | Masayuki et al. | 257/777 |
| 6,504,244 B2 | * | 1/2003 | Ichinose et al. | 257/723 |
| 6,740,981 B2 | * | 5/2004 | Hosomi | 257/778 |
| 6,807,061 B1 | * | 10/2004 | Harris | 361/719 |
| 6,873,529 B2 | * | 3/2005 | Ikuta et al. | 361/719 |
| 7,173,325 B2 | * | 2/2007 | Vasoya et al. | 257/686 |
| 7,180,165 B2 | * | 2/2007 | Ellsberry et al. | 257/686 |
| 7,482,203 B2 | * | 1/2009 | Song et al. | 438/109 |
| 7,494,846 B2 | * | 2/2009 | Hsu et al. | 438/109 |
| 7,545,031 B2 | * | 6/2009 | Kwon | 257/686 |
| RE42,363 E | * | 5/2011 | Ellsberry et al. | 257/686 |
| 7,999,367 B2 | * | 8/2011 | Kang et al. | 257/686 |

* cited by examiner

*Primary Examiner* — Anatoly Vortman
(74) *Attorney, Agent, or Firm* — Stites & Harbison, PLLC; Juan Carlos A. Marquez, Esq

(57) ABSTRACT

A multi-layer system-on-chip (SoC) module structure is provided. The multi-layer SoC module structure includes at least two circuit board module layers and at least one connector module layer. Each connector module layer is sandwiched between and thus electrically connects two circuit board module layers such that the SoC module structure is formed by stacking. Each circuit board module layer is composed of at least one circuit board while each connector module layer is composed of at least one connector module. Hence, the SoC module structure can be manufactured as a three-dimensional structure, thus allowing highly flexible connections within the SoC module structure.

18 Claims, 5 Drawing Sheets

MULTI-LAYER SOC MODULE STRUCTURE

BACKGROUND OF THE INVENTION

1. Technical Field

The present invention relates to multi-layer system-on-chip (SoC) module structures and, more particularly, to a multi-layer SoC module structure applicable to SoCs.

2. Description of Related Art

Electronic products play an important role in our daily lives and have a bigger market share each year. In order to grab consumers' attention and claim an early market share, it is necessary for manufacturers to continuously develop a variety of electronic products that suit consumers' habit of use. More importantly, product development must be completed in a short time frame.

In an attempt to shorten product development cycles and reduce costs, it is common practice for SoC modules in different products to be designed with basic structures that have the same specifications. For instance, the SoC-based fundamental-frequency components of portable communication products of different models may use elements having the same specifications, such as microcontrollers, digital signal processors, buses, digital-analog converters, codecs, modulators, and so on. After the basic structures are selected, system designers design and add extended functions to the basic structures according to market needs and cost considerations, so as to form portable communication products with different powers.

During the aforesaid development and design stages of SoC modules, system designers may select the basic structures on their own or use the basic structures provided by manufacturers. It is also possible to introduce silicon intellectual property from external design teams. In either case, however, the designed SoC modules must be fabricated and verified. Therefore, even though system designers have participated in the entire design process, the subsequent fabrication and verification still require high labor costs.

If the design process can be further extended into and integrated with fabrication and verification, that is, if certain elements of a packaged SoC modules are pre-fabricated and verified products, then system designers will be allowed to focus only on the design, fabrication, and verification of those elements with the additional extended functions. Thus, the time required for developing and testing SoC modules can be significantly shortened, and design errors are minimized, thereby lowering the development costs. Moreover, as consumers strongly prefer compact electronic products, with the volume of the SoC module effectively reduced, the finished electronic products are far more likely to satisfy consumers.

BRIEF SUMMARY OF THE INVENTION

It is an objective of the present invention to provide a multi-layer SoC module structure wherein each connector module layer is configured to electrically connect two circuit board module layers. Thus, the SoC module structure is constructed as a three-dimensional structure and allows system designers to design SoC module structures in a highly flexible manner.

It is another objective of the present invention to provide a multi-layer SoC module structure wherein connector modules are configured to allow the addition of circuit board modules according to practical needs, thereby facilitating the function-extension ability of SoC modules.

It is another objective of the present invention to provide a multi-layer SoC module structure wherein circuit board modules in the circuit board module layers can be fabricated and verified in advance so as to shorten the verification time of SoC modules.

It is another objective of the present invention to provide a multi-layer SoC module structure which allows system designers to combine circuit board modules of different functions and thus form various SoC modules.

It is another objective of the present invention to provide a multi-layer SoC module structure wherein circuit board modules can be fabricated and verified in advance such that system designers only have to design extended functions for special specifications, thus saving the time and costs of development.

To achieve the above and other objectives, the present invention provides a multi-layer SoC module structure which includes: at least two circuit board module layers, each circuit board module layer being composed of at least one circuit board module, wherein each circuit board module includes a first circuit board, at least one preset element provided on and electrically connected to the first circuit board, and at least one first connection interface provided on and electrically connected to the first circuit board and electrically connected to the said preset element; and at least one connector module layer composed of at least one connector module, wherein each connector module layer is sandwiched between two of the circuit board module layers such that the first connection interfaces of the two multi-layer circuit board module layers are electrically connected to each other.

Implementation of the present invention involves at least the following inventive steps:

1. With each connector module layer electrically connecting two circuit board module layers, the SoC module structure is constructed as a three-dimensional structure, thus increasing the structural flexibility of SoC modules.

2. The provision of the connector modules allows the circuit board modules to be added as appropriate. Thus, the functions of SoC modules can be easily extended.

3. As the circuit board modules in the circuit board module layers can be fabricated and verified beforehand, the verification time of SoC modules can be shortened to reduce the time and cost of development.

4. System designers may combine circuit board modules of different functions so as to form a diversity of SoC modules.

BRIEF DESCRIPTION OF THE SEVERAL VIEWS OF THE DRAWINGS

A detailed description of further features and advantages of the present invention is given below so that a person skilled in the art is enabled to understand and implement the technical contents of the present invention and readily comprehend the objectives and advantages thereof by reviewing the disclosure of the present specification and the appended claims in conjunction with the accompanying drawings, in which:

DETAILED DESCRIPTION OF THE INVENTION

Figure 1:
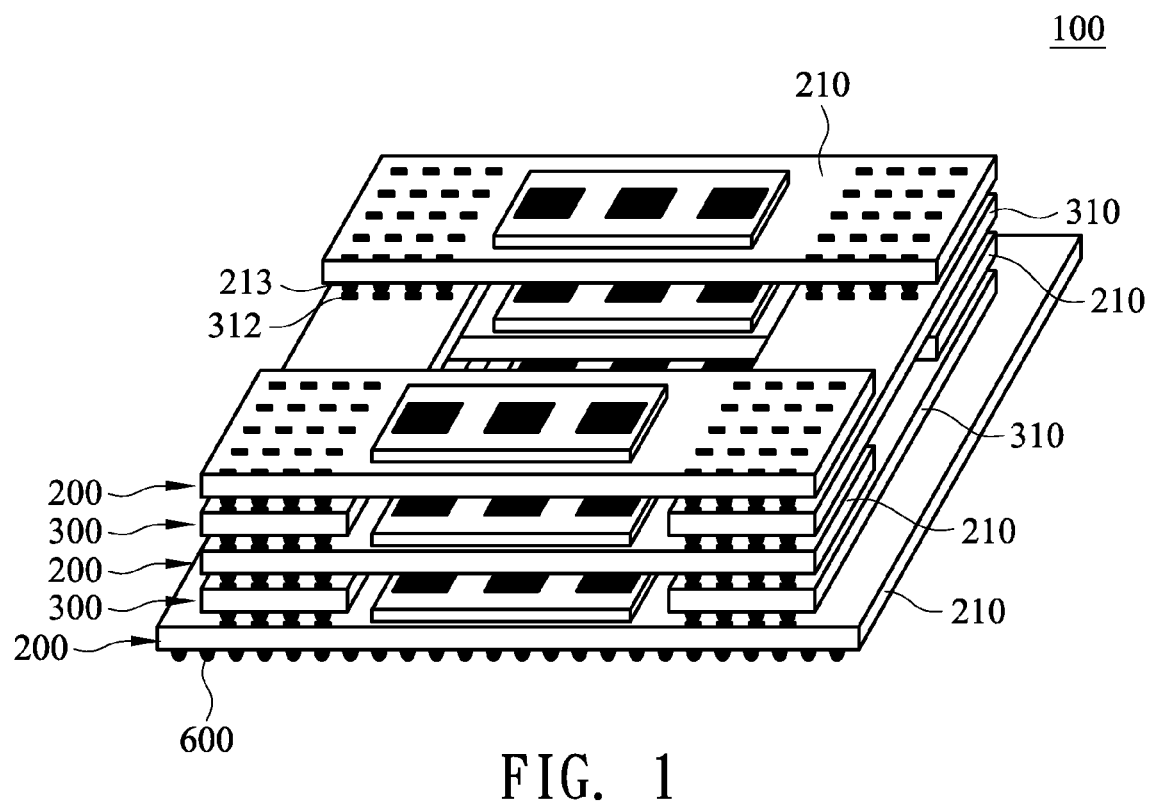
FIG. 1 is a perspective view of a multi-layer SoC module structure according to a first embodiment of the present invention.

Referring to FIG. 1, according to an embodiment of the present invention, a multi-layer SoC module structure 100 includes at least two circuit board module layers 200 and at least one connector module layer 300. Each connector module layer 300 is sandwiched between two circuit board module layers 200 such that the two circuit board module layers 200 are electrically connected to each other by the connector module layer 300 sandwiched therebetween. Thus, the SoC module structure 100 is constructed as a three-dimensional structure and has a reduced volume.

Figure 2:
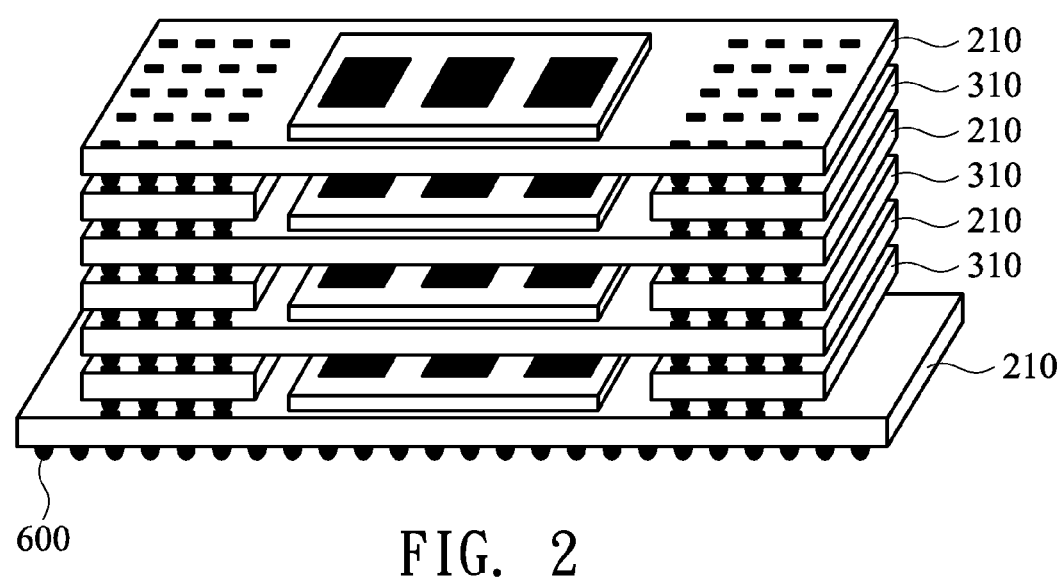
FIG. 2 is a perspective view of a multi-layer SoC module structure according to a second embodiment of the present invention.
Figure 3A:
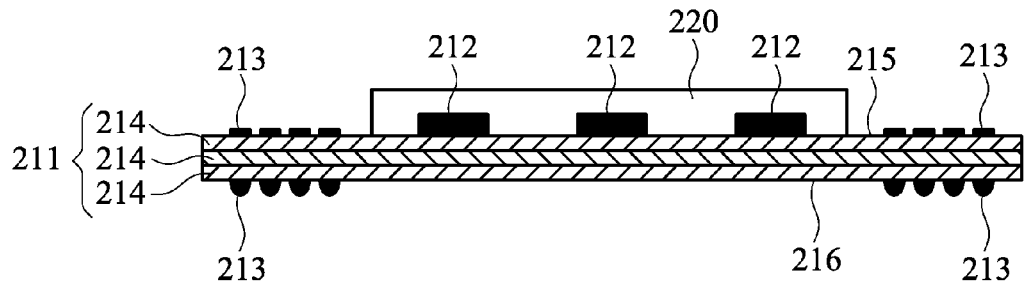
FIG. 3A shows a first aspect of a circuit board module according to the present invention.
Figure 3B:
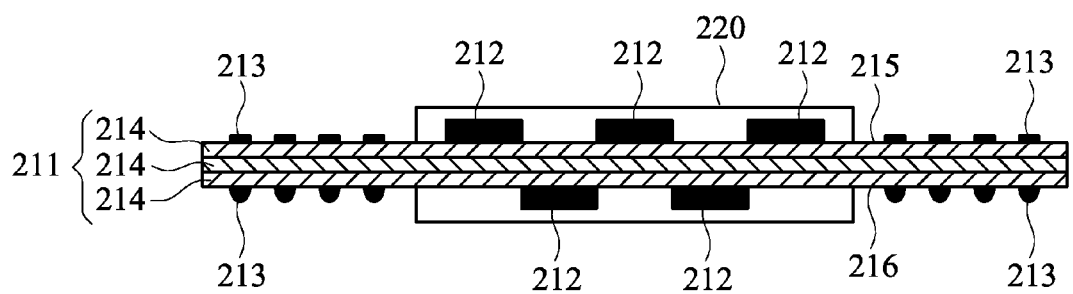
FIG. 3B shows a second aspect of the circuit board module according to the present invention.

As shown in FIG. 1 and FIG. 2, each circuit board module layer 200 is composed of at least one circuit board module 210, and the at least one circuit board module 210 forms a planar structure. Referring to FIG. 3A and FIG. 3B, the circuit board module 210 includes a first circuit board 211, at least one preset element 212, and at least one first connection interface 213.

As shown in FIG. 3A and FIG. 3B, the first circuit board 211 is composed of at least two first circuit layers 214, wherein the outermost first circuit layers 214 form a first surface 215 and a second surface 216, respectively. The first surface 215 is depicted as an upper surface of the first circuit board 211, and the second surface 216 as a lower surface of the first circuit board 211. The first circuit layers 214, though each having an independent circuit design, are electrically connected to one another. Therefore, the first circuit board 211 can be built-in with a high-density circuit structure so as to serve in more complex applications.

With reference to FIG. 3A, the preset elements 212 of the circuit board module 210 are provided on and electrically connected to the first circuit board 211. Electrical connection between the preset elements 212 and the first circuit board 211 can be accomplished by flip-chip, wire bonding, and like techniques.

The preset elements 212 may include at least one die or a plurality of dies or non-die elements. As the dies are bare dies, the circuit board module 210 further includes an encapsulation 220 for encapsulating the dies and preventing the dies from being affected by moisture or damaged by external force. On the other hand, non-die elements can be electrically connected to the first circuit board 211 using a stacked package technique (not shown) such that the preset elements 212 of the circuit board module 210 includes stacked package elements. The preset elements 212 may also include at least one chip or a plurality of chips, wherein the chips are packaged chips (not shown).

Each preset element 212 can be a processor element, a memory element, an input/output element, a wireless device element, a power management element, a sensor element, a heat dissipation element, a display element, etc. Depending on the types and functions of the preset elements 212, the circuit board module 210 can be a processor sub-module, a memory sub-module, an input/output sub-module, a wireless device sub-module, a power management sub-module, a power supply sub-module, a sensor sub-module, a heat dissipation sub-module, a display sub-module, a connecting and wiring sub-module, or a combination thereof.

The first connection interfaces 213 are provided on and electrically connected to the first circuit board 211 and electrically connected to the preset elements 212. The first connection interfaces 213 can be a plurality of solder pads or solder balls, wherein the solder balls may form ball grid arrays. The first connection interfaces 213, which may be provided on the first surface 215 alone or on both the first surface 215 and the second surface 216, are electrically connected to the corresponding first circuit layers 214.

For example, as shown in FIG. 3A and FIG. 3B, the first surface 215 is provided with a plurality of solder pads, and the solder pads are electrically connected to the first circuit layer 214 that forms the first surface 215. Meanwhile, the second surface 216 is provided with a plurality of solder balls, and the solder balls are electrically connected to the first circuit layer 214 that forms the second surface 216. Since electrical connection is already established between the aforesaid two first circuit layers 214, the solder pads and the solder balls are electrically connected to each other.

As shown in FIG. 3A, the preset elements 212 are provided only on the first surface 215 and are electrically connected to the first circuit layer 214 that forms the first surface 215, so that the external electrical connections can be formed via the solder balls and the solder pads. Alternatively, the preset elements 212 can be provided only on the second surface 216 (not shown) and electrically connected to the first circuit layer 214 that forms the second surface 216. Or, as shown in FIG. 3B, the preset elements 212 are provided on both the first surface 215 and the second surface 216 and are electrically connected to the first circuit layer 214 that forms the first surface 215 and to the first circuit layer 214 that forms the second surface 216, respectively. In the latter case, the preset elements 212 provided on both the first surface 215 and the second surface 216 can form external electrical connections via the solder pads and the solder balls.

Figure 4A:
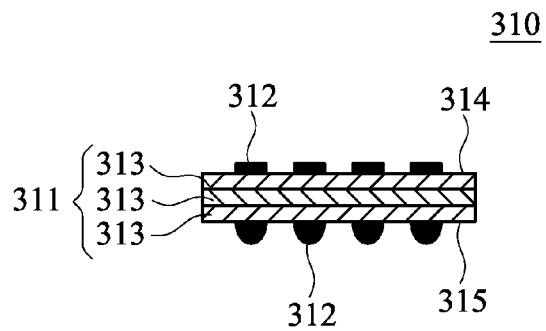
FIG. 4A shows a first aspect of a connector module according to the present invention.
Figure 4B:
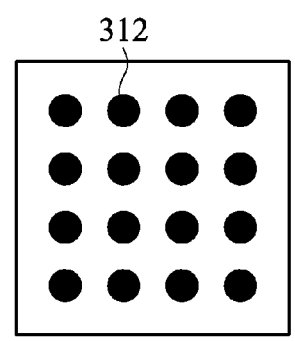
FIG. 4B shows a second aspect of the connector module according to the present invention.

Referring back to FIG. 1, each connector module layer 300 is composed of at least one connector module 310, and the at least one connector module 310 forms a planar structure. With reference to FIG. 4A and FIG. 4B, the connector module 310 includes a second circuit board 311 and at least two second connection interfaces 312.

The second circuit board 311 is composed of at least two second circuit layers 313, wherein the outermost second circuit layers 313 form a third surface 314 and a fourth surface 315, respectively. The third surface 314 is depicted as an upper surface of the second circuit board 311, and the fourth surface 315 as a lower surface of the second circuit board 311. Likewise, each of the second circuit layers 313 has an independent circuit design, and the second circuit layers 313 are electrically connected to one another, thus allowing a high-density circuit structure to be built in the second circuit board 311.

The second connection interfaces 312 are provided on the third surface 314 and the fourth surface 315 of the second circuit board 311, respectively, and are electrically connected to the corresponding second circuit layers 313. Each second connection interface 312 can be a ball grid array, as shown in FIG. 4B.

Referring again to FIG. 1 and FIG. 2, the second connection interfaces 312 of each connector module 310 are electrically connected to the first connection interfaces of the corresponding circuit board modules 210. Thus, the connector module layer 300 sandwiched between each two circuit board module layers 200 provides an electrical signal transmission path for the circuit board modules 210. The connector modules 310 serve to connect the circuit board modules 210 both horizontally and vertically.

Figure 5A:
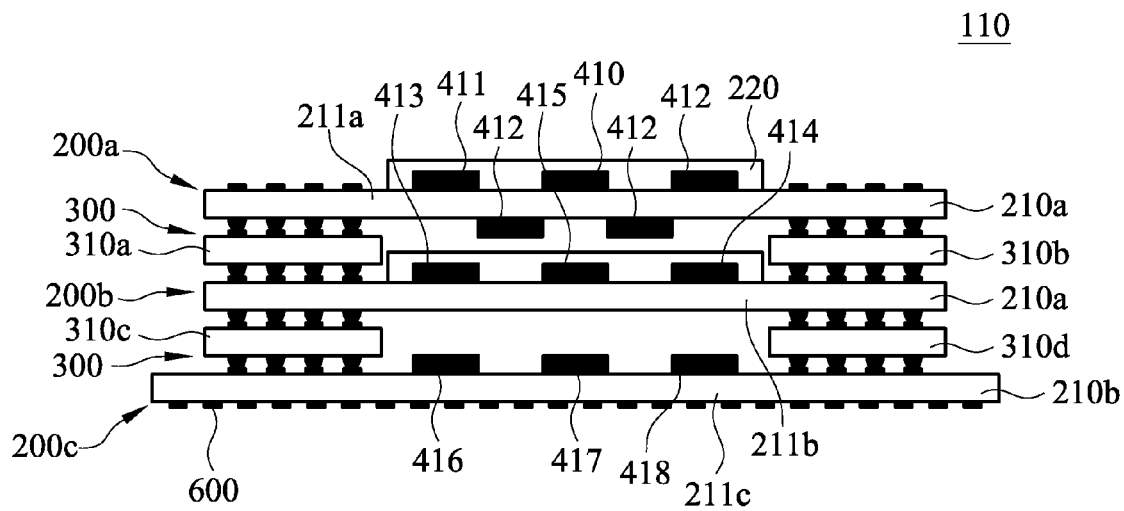
FIG. 5A is a sectional view of a first aspect of the multi-layer SoC module structure according to the present invention.
Figure 7:
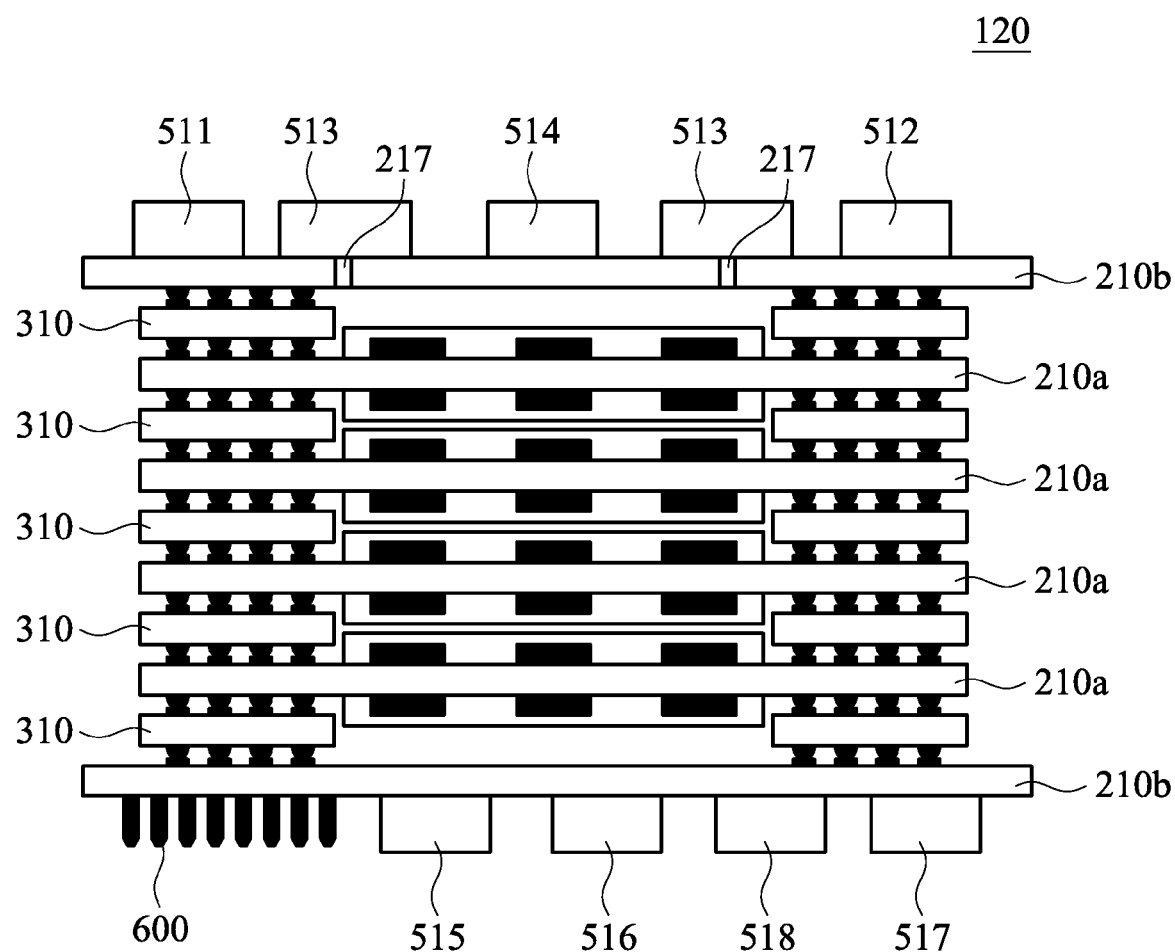
FIG. 7 shows an application of the multi-layer SoC module structure according to the present invention.

Referring to FIG. 5A and FIG. 7, the circuit board modules 210 can be categorized as common-element circuit board modules 210a and functional-element circuit board modules 210b according to the types of the preset elements 212 in the circuit board modules 210. For instance, the common-element circuit board modules 210a can be processor sub-modules, memory sub-modules, etc., and the functional-element circuit board modules 210b can be input/output sub-modules, wireless device sub-modules, power management sub-modules, power supply sub-modules, sensor sub-modules, heat dissipation sub-modules, display sub-modules, connecting and wiring sub-module, etc.

System designers may interconnect the common-element circuit board modules 210a by means of the connector modules 310 and then add the functional-element circuit board modules 210b according to the desired functions, thus easily extending the functions of the SoC module structure 100. Since all the circuit board modules 210 can be fabricated and verified in advance, the verification time of the SoC module structure 100 can be shortened substantially to reduce the time and costs of development.

For example, with reference to FIG. 5A, a SoC module structure 110 is made of a plurality of circuit board module layers 200a, 200b, 200c and a plurality of connector module layers 300. The circuit board module layer 200a includes a common-element circuit board module 210a in which a processor element 410, a north bridge chip element 411, and dynamic random access memory (DRAM) elements 412 are all provided on the same first circuit board 211a. In the other circuit board module layer 200b, a south bridge chip element 413, a micro hard disc element 414, and a flash memory element 415 are all provided on the same first circuit board 211b. In another circuit board module layer 200c, a display chip element 416, a network device element 417, and an input/output element 418 are all provided on the same first circuit board 211c.

Figure 5B:
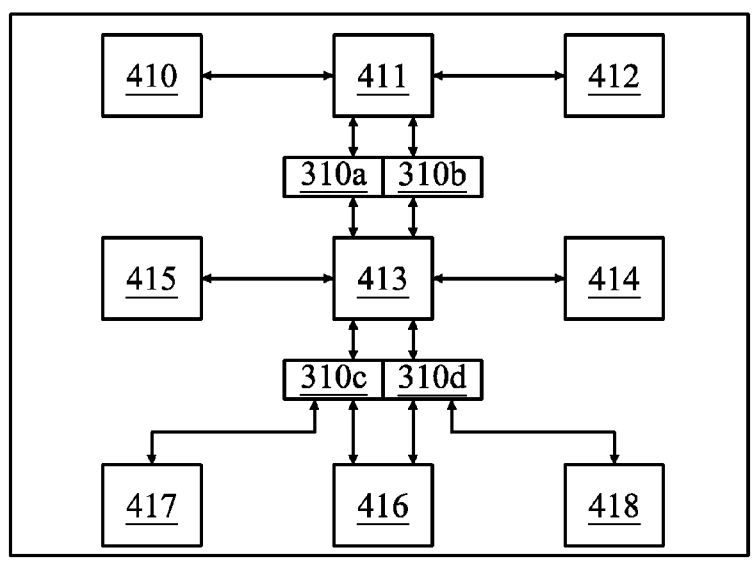
FIG. 5B is a circuit block diagram of the multi-layer SoC module structure shown in FIG. 5A.

FIG. 5B is a circuit block diagram of the circuit board modules 210a, 210b and connector modules 310a, 310b, 310c, 310d. As shown in FIG. 5B, the processor element 410 and the DRAM elements 412 can exchange electrical signals with the south bridge chip element 413 by way of the north bridge chip element 411 while the north bridge chip element 411 and the south bridge chip element 413 are electrically connected to each other by the two connector modules 310a, 310b. The south bridge chip element 413 is further electrically connected to the micro hard disc element 414 and the flash memory element 415. In addition, the display chip element 416, the network device element 417, and the input/output element 418 are electrically connected to the south bridge chip element 413 by the two connector modules 310c, 310d. Thus, the resultant SoC module structure 110 is fully provided with the functions of a personal computer.

Figure 6A:
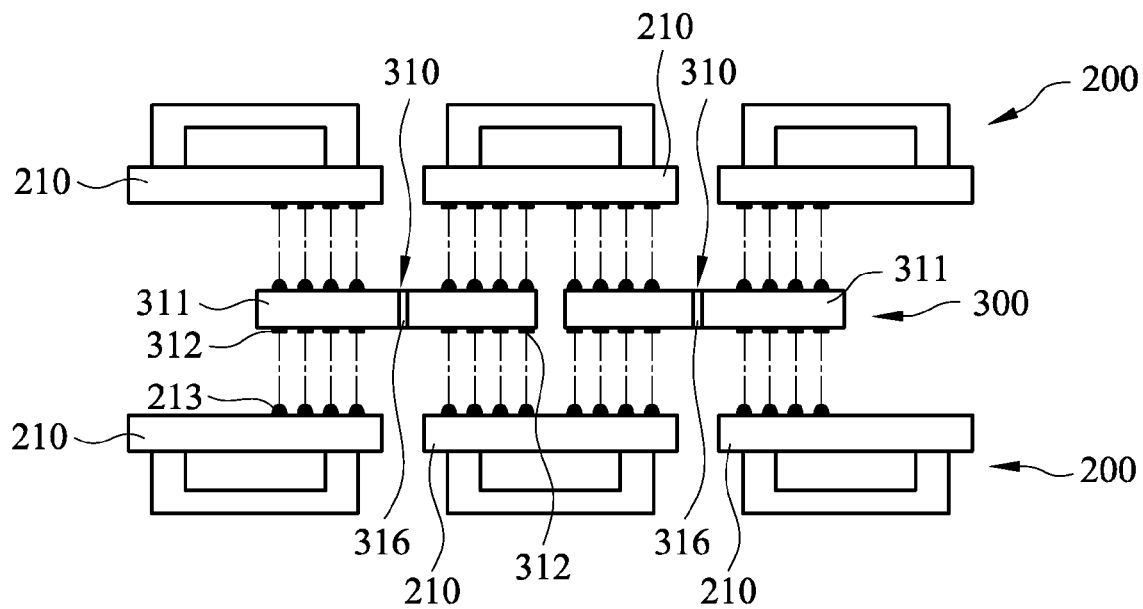
FIG. 6A is an exploded sectional view of a second aspect of the multi-layer SoC module structure according to the present invention.

Preferably, the first connection interfaces 213 of the circuit board modules 210 match the second connection interfaces 312 of the connector modules 310 in specification. Thus, system designers may add more circuit board modules 210 via the connector modules 310 wherever and whenever desired and may connect the circuit board modules 210 in many different ways. For example, referring to FIG. 6A, each circuit board module layer 200 includes three circuit board modules 210 while the connector module layer 300 includes two connector modules 310. Moreover, as shown in FIG. 6A, the second connection interfaces 312 of each connector module 310 are disposed at two ends of the second circuit board 311, respectively, such that the connector modules 310 function as electrical signal transmission paths between the circuit board modules 210. In another example, as shown in FIG. 6B, connector modules 310e not only enable horizontal transmission of electrical signals but also are electrically connected to connector modules 310f, which are provided between the connector modules 310e, so as to form vertical electrical signal transmission paths.

Figure 6B:
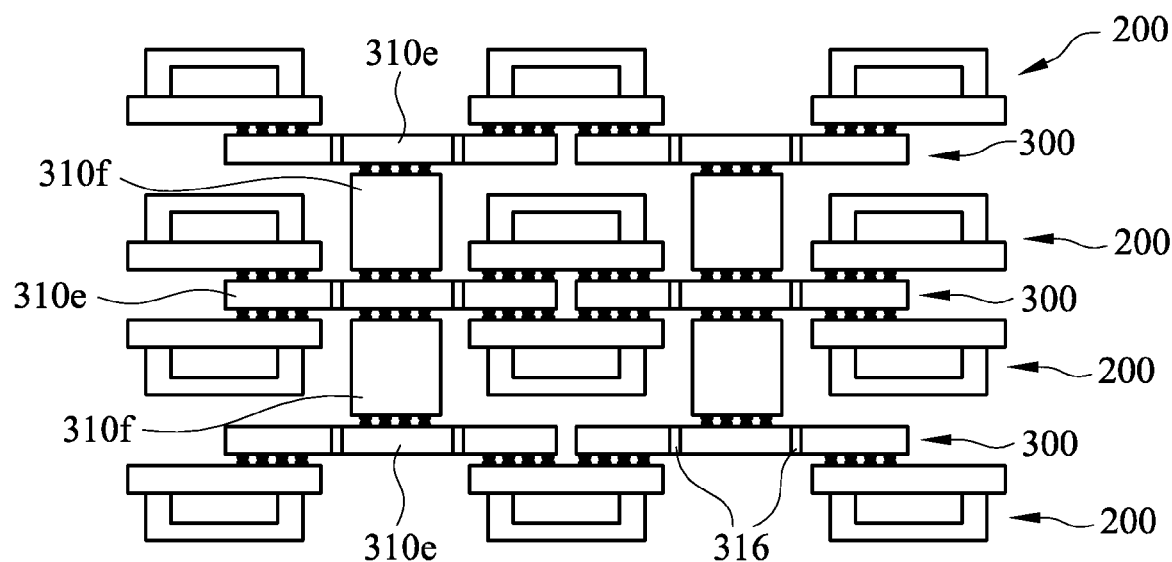
FIG. 6B is a sectional view of a third aspect of the multi-layer SoC module structure according to the present invention.

As shown in FIG. 6A and FIG. 6B, in order to enhance heat dissipation from the SoC module structure 100, the second circuit board 311 of each connector module 310 is formed with at least one heat dissipation hole 316, thus allowing heat to dissipate through the heat dissipation holes 316. Besides, as shown in FIG. 7, the functional-element circuit board modules 210b may have heat dissipation holes 217. Similarly, the common-element circuit board modules 210a may also have heat dissipation holes (not shown), thereby improving the heat dissipation efficiency of the circuit board modules 210a, 210b.

In the SoC module structure 120 shown in FIG. 7, the common-element circuit board modules 210a are constructed and assembled first, and then the functional-element circuit board modules 210b are provided as the outermost layers of the SoC module structure 120 so as to extend the functions of the SoC module structure 120. The functional-element circuit board modules 210b include, for example, an input port element 511, an output port element 512, heat dissipation elements 513, a wireless device element 514, a universal serial bus (USB) element 515, a display element 516, a network port element 517, and a universal asynchronous receiver/transmitter (UART) element 518. Preferably, with a view to further increasing the heat dissipation efficiency of the functional-element circuit board modules 210b and consequently of the SoC module structure 120, the heat dissipation elements 513 correspond in position to the dissipation holes 217 for helping the heat dissipating through the dissipation holes 217.

As shown in FIGS. 1, 2, 5A, and 7, the outermost circuit board modules 210 can be further provided with a contact-type connecting portion 600. The contact-type connecting portion 600, provided on and electrically connected to the first circuit board 211, can be a gold finger (not shown), a pin grid array (as shown in FIG. 7), a ball grid array (as shown in FIG. 1 and FIG. 2), or a land grid array (as shown in FIG. 5). The contact-type connecting portion 600 allows the SoC module structures 100, 110, 120 to be electrically connected to an external power supply or device.

The foregoing embodiments are illustrative of the characteristics of the present invention so as to enable a person skilled in the art to understand the disclosed subject matter and implement the present invention accordingly. The embodiments, however, are not intended to restrict the scope of the present invention. Hence, all equivalent modifications and variations made in the foregoing embodiments without departing from the spirit and principle of the present invention should fall within the scope of the appended claims.

What is claimed is:

1. A multi-layer SoC module structure, comprising:
   at least two circuit board module layers, each said circuit board module layer being composed of at least one circuit board module, each said circuit board module comprising:

a first circuit board;

at least one preset element provided on and electrically connected to the first circuit board; and at least one first connection interface provided on and electrically connected to the first circuit board and electrically connected to the at least one preset element; and at least one connector module layer composed of at least one connector module, each said connector module layer being sandwiched between two said circuit board module layers such that the first connection interfaces of the two said circuit board module layers are electrically connected to each other;

wherein each said connector module comprises: a second circuit board comprising at least two second circuit layers, of which two said second circuit layers form a third surface and a fourth surface of the second circuit board, respectively; and at least two second connection interfaces provided on the third surface and the fourth surface, respectively, and electrically connected to corresponding said second circuit layers, respectively, at least two second connection interfaces being further electrically connected to the first connection interfaces of two said circuit board module layers, respectively.

2. The multi-layer SoC module structure of claim 1, wherein each said circuit board module is a processor sub-module, a memory sub-module, an input/output sub-module, a wireless device sub-module, a power management sub-module, a power supply sub-module, a sensor sub-module, a heat dissipation sub-module, a display sub-module, a connecting and wiring sub-module, or a combination thereof.

3. The multi-layer SoC module structure of claim 1, wherein each said circuit board module has at least one heat dissipation hole.

4. The multi-layer SoC module structure of claim 1, wherein each said first circuit board comprises at least two first circuit layers, of which two said first circuit layers form a first surface and a second surface of the each said first circuit board, respectively.

5. The multi-layer SoC module structure of claim 1, wherein each said preset element comprises at least one die or at least one chip.

6. The multi-layer SoC module structure of claim 1, wherein each said preset element comprises a plurality of dies or a plurality of chips.

7. The multi-layer SoC module structure of claim 6, wherein the plurality of dies or the plurality of chips of each said preset element are provided on a first surface or a second surface of a corresponding said first circuit board.

8. The multi-layer SoC module structure of claim 6, wherein the plurality of dies or the plurality of chips of each said preset element are provided on a first surface and a second surface of a corresponding said first circuit board, respectively.

9. The multi-layer SoC module structure of claim 1, wherein each said circuit board module further comprises at least one encapsulation for encapsulating the corresponding said preset element.

10. The multi-layer SoC module structure of claim 1, wherein at least one first connection interface of each said circuit board module is provided on a first surface or a second surface of a corresponding said first circuit board.

11. The multi-layer SoC module structure of claim 1, wherein each said first connection interface is a ball grid array.

12. The multi-layer SoC module structure of claim 1, wherein each said first circuit board is further provided with a contact-type connecting portion provided on and electrically connected to each said first circuit board.

13. The multi-layer SoC module structure of claim 12, wherein the contact-type connecting portion is a ball grid array.

14. The multi-layer SoC module structure of claim 12, wherein the contact-type connecting portion is a pin grid array.

15. The multi-layer SoC module structure of claim 12, wherein the contact-type connecting portion is a land grid array.

16. The multi-layer SoC module structure of claim 1, wherein each said second connection interface is a ball grid array.

17. The multi-layer SoC module structure of claim 1, wherein each said connector module has at least one heat dissipation hole.

18. The multi-layer SoC module structure of claim 1, wherein the said first connection interface of each said circuit board module is provided on a first surface and a second surface of a corresponding said first circuit board.

* * * * *